(12) United States Patent
Han et al.

(10) Patent No.: US 6,521,924 B2
(45) Date of Patent: Feb. 18, 2003

(54) IMAGE SENSOR INCORPORATING THEREIN A CAPACITOR STRUCTURE AND METHOD FOR THE MANUFACTURE THEREOF

(75) Inventors: Jin-Su Han, Ichon-shi (KR); Hoon-Sang Oh, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 09/742,817

(22) Filed: Dec. 19, 2000

(65) Prior Publication Data

US 2001/0006238 A1 Jul. 5, 2001

(30) Foreign Application Priority Data

Dec. 28, 1999 (KR) .............................. 99-63839

(51) Int. Cl.[7] ...................... H01L 31/062; H01L 31/113
(52) U.S. Cl. ...................... 257/290; 257/225; 257/229; 257/296; 257/431
(58) Field of Search .............................. 257/187, 215, 257/225, 290–292, 296, 431, 222–223, 228–229; 438/210, 238–241

(56) References Cited

U.S. PATENT DOCUMENTS

| | | | |
|---|---|---|---|
| 5,356,826 A | * 10/1994 | Natsume | 148/DIG. 136 |
| 5,760,458 A | * 6/1998 | Bergemont et al. | 250/208.1 |
| 6,057,572 A | * 5/2000 | Ito et al. | 257/296 |
| 6,103,621 A | * 8/2000 | Huang | 438/239 |
| 6,204,524 B1 | * 3/2001 | Rhodes | 257/222 |
| 6,255,703 B1 | * 7/2001 | Hause et al. | 257/382 |

FOREIGN PATENT DOCUMENTS

JP  5-13739  * 1/1993

* cited by examiner

Primary Examiner—Carl Whitehead, Jr.
Assistant Examiner—Jamie L. Brophy
(74) Attorney, Agent, or Firm—Townsend and Townsend and Crew LLP

(57) ABSTRACT

An image sensor includes a plurality of unit pixels for sensing a light beam to generate an image data. Each of the unit pixels includes, a photoelectric element for sensing a light beam incident thereto and generating photoelectric charges, a transistor including a gate dielectric formed adjacent to the photoelectric element and a gate electrode formed on top of the gate dielectric and a capacitor structure including an insulating film formed on a portion of the photoelectric element and a bottom electrode, wherein the insulating film and the gate dielectric are made of a same material and the bottom electrode and the gate electrode are made of a same material.

12 Claims, 11 Drawing Sheets

IMAGE SENSOR INCORPORATING THEREIN A CAPACITOR STRUCTURE AND METHOD FOR THE MANUFACTURE THEREOF

FIELD OF THE INVENTION

The present invention relates to an image sensor; and, more particularly, to an image sensor incorporating therein a capacitor structure for improving an optical efficiency of the image sensor.

DESCRIPTION OF THE PRIOR ART

As is well known, an image sensor is a semiconductor device for sensing a light reflected from an object to generate an image data. Especially, an image sensor fabricated by using a complementary metal oxide semiconductor (CMOS) technology is called a CMOS image sensor.

Generally, the CMOS image sensor includes a plurality of unit pixels. Each of the unit pixels also includes a light sensing element and a plurality of transistors. The light-sensing element such as a photodiode senses incident light reflected from an object and accumulates photoelectric charges that are generated due to the incident light. The transistors control a transfer of the photoelectric charges.

In FIG. 1, there is shown a prior art image sensor 100 including: a silicon substrate 102, a photodiode 120 formed into the silicon substrate 102 for sensing a light beam incident thereto and generating photoelectric charges, a capacitor structure 130 formed on the silicon substrate 102 and the photodiode 120, a diffusion region 106, a transfer transistor 110 formed on the photodiode 120, the diffusion region 106 and an isolation region 104.

In the image sensor 100, the transfer transistor 110 is provided with a gate dielectric 112, a gate electrode 114 and a spacer 116. The transfer transistor 110 is coupled to a sensing node for transferring the photoelectric charges to the sensing rode in response to a transfer control signal. The capacitor structure 130 is provided with an insulating film 132, a bottom electrode 134, a capacitor dielectric 136 and a top electrode 138. In case when the photodiode 120 does not have sufficient capacitance, a certain portion of the photoelectric charges cannot be stored in the photodiode 120, which will, in turn, leak out into the silicon substrate 102, thereby decreasing an overall optical efficiency thereof and making noses in the image sensor 100. These problems can be eliminated by using the capacitor structure 130 which is capable of providing additional capacitances to the photodiode 120.

In FIGS. 2A to 2D, there are illustrated manufacturing steps involved in manufacturing the conventional image sensor 100.

The process for manufacturing the conventional image sensor 100 begins with the preparation of an active matrix having a silicon substrate 102, a transfer transistor structure 110 formed thereon, an isolation region 104 and a photodiode 120 formed into the silicon substrate 102, as shown in FIG. 2A. An insulating layer 132, e.g., made of SiOx, is formed over the entire surface by using a chemical vapor deposition (CVD) technique. The photodiode 120 is capable of converting a light beam incident thereto into photoelectric charges. The transfer transistor 110 includes a gate oxide 112, a gate electrode 114 and a spacer 116. The transfer transistor 110 is coupled to a sensing node 106 for transferring the photoelectric charges to the sensing node 106 in response to a transfer control signal. The sensing node 106 can be connected to a transistor such as a reset transistor or an amplification transistor not shown for the sake of simplicity.

Referring to FIG. 2B, an insulating layer 132, e.g., made of silicon oxide ($SiO_2$), is formed on top of the active matrix by using a method such as CVD. Thereafter, the insulating layer 132 is patterned into a first predetermined configuration to form a contact hole.

In a next step, a bottom electrode layer 134, a capacitor dielectric layer 136 and a top electrode layer 138 are formed on the insulating layer 132, successively, as shown in FIG. 2C.

Finally, the top electrode layer 138, the capacitor dielectric layer 136 and the bottom electrode layer 134 are patterned into a second predetermined configuration, thereby obtaining a capacitor structure 130.

One of the major shortcomings of the above-described image sensor 100 is that it has complex manufacturing steps to form the capacitor structure 130 on the photodiode 120.

SUMMARY OF THE INVENTION

It is, therefore, an object of the present invention to provide an image sensor incorporating therein a capacitor structure for improving an optical efficiency thereof.

It is another object of the present invention to provide a method for manufacturing an image sensor incorporating therein a capacitor for improving an optical efficiency thereof.

In accordance with an aspect of the present invention, there is provided an image sensor provided with a plurality of unit pixels, each unit pixel comprising: a photoelectric element for sensing a light beam incident thereto and generating photoelectric charges; a transistor including a gate dielectric formed adjacent to the photoelectric element and a gate electrode formed on top of the gate dielectric; and a capacitor structure including an insulating film formed on a portion of the photoelectric element and a bottom electrode, wherein the insulating film and the gaze dielectric are made of a same material and the bottom electrode and the gate electrode are made of a same material.

In accordance with another aspect of the present invention, there is provided a method for manufacturing an image sensor, the method comprising the steps of: a) preparing a silicon substrate; b) forming a first dielectric layer and a first conductive layer, successively; c) patterning the first dielectric layer and the first conductive layer to obtain an insulating film and a bottom electrode of a capacitor structure and a gate dielectric and a gate electrode of a transistor, simultaneously; d) implanting a first type of dopants into a portion of the silicon substrate which is not covered with the insulating film and the gate dielectric and placed therebetween, thereby forming a photoelectric element; e) forming a second dielectric layer; f) removing a portion of the second dielectric layer which is located on top of the photoelectric element, thereby forming a contact hole; g) forming a second conductive layer on top of the second dielectric layer and the contact hole; and h) removing portions of the second conductive layer and the second dielectric layer which are placed on top of the gate electrode and the remaining portion of the photoelectric element.

BRIEF DESCRIPTION OF THE DRAWINGS

Other objects and aspects of the invention will become apparent from the following description of the embodiments with reference to the accompanying drawings, in which.

DETAILED DESCRIPTION OF THE PREFERRED EMBODIMENTS

There are provided in FIGS. 3, 4A to 4E, 5 and 6A to 6E a cross sectional views of CMOS image sensors 200, 300 and cross sectional views setting forth methods for the manufacture thereof in accordance with preferred embodiments of the present invention.

Figure 1:
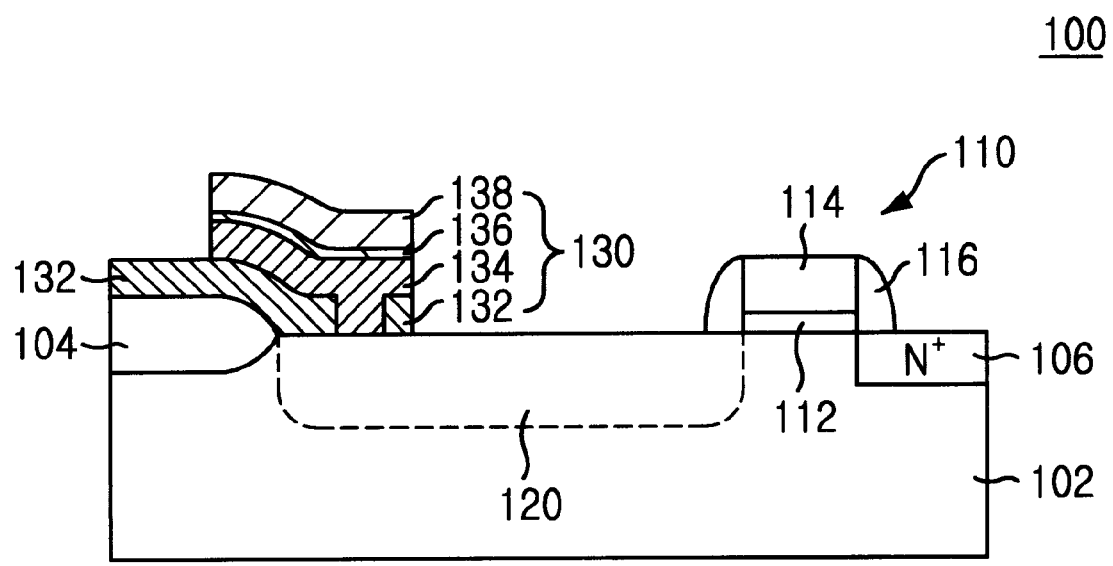
FIG. 1 is a cross-sectional view showing a prior art CMOS image sensor.
Figure 2A:
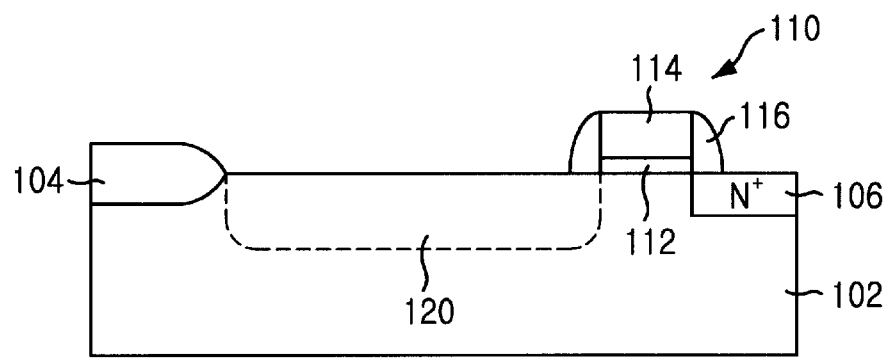
FIGS. 2A to 2D provide cross-sectional views presenting a prior art method for manufacture of the CMOS image sensor shown in FIG. 1.
Figure 2B:
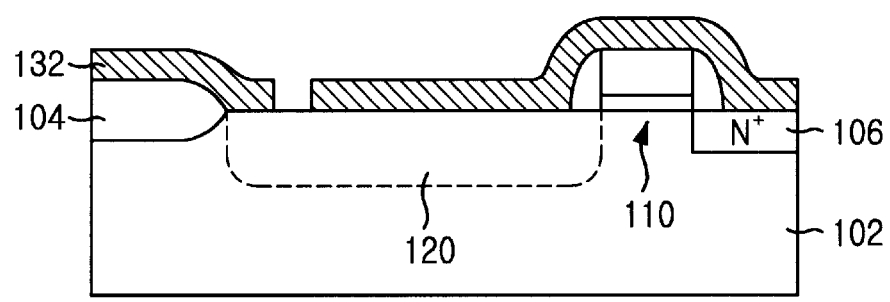
Figure 2C:
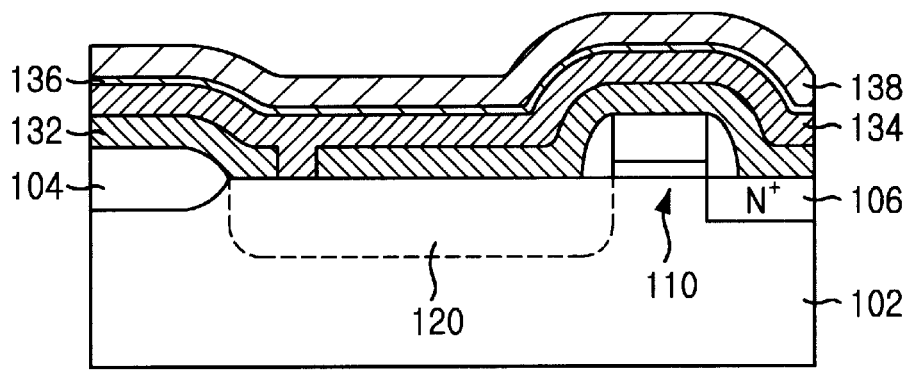
Figure 2D:
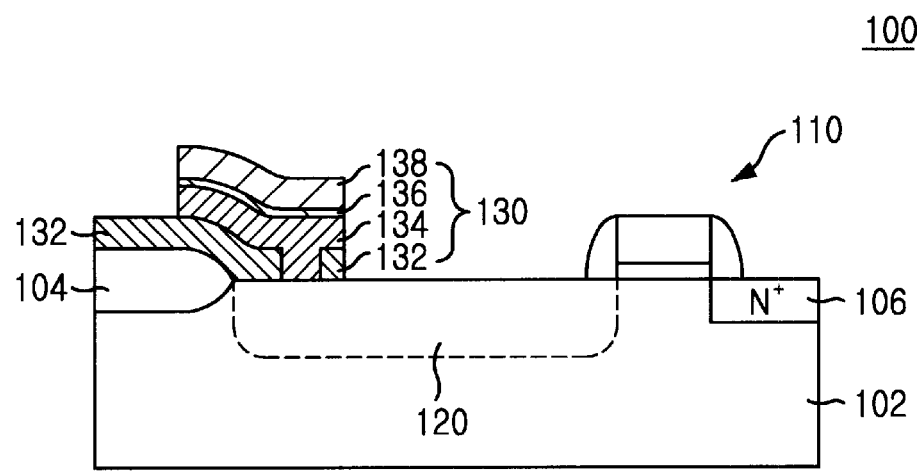
Figure 3:
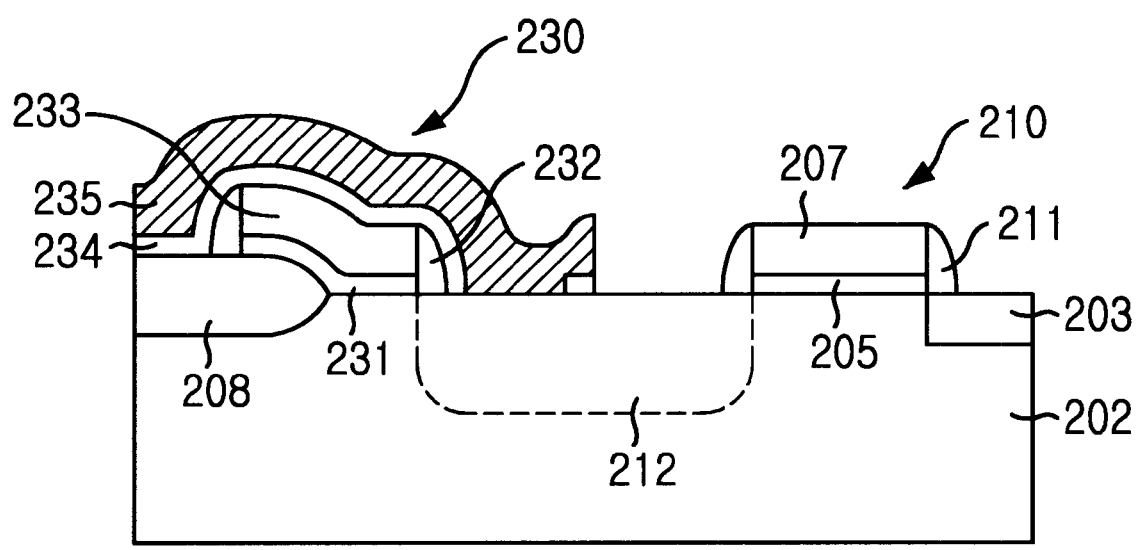
FIG. 3 illustrates a cross-sectional view representing a CMOS image sensor in accordance with a first preferred embodiment of the present invention.

In FIG. 3, there is provided a cross sectional view of the inventive image sensor 200 comprising a silicon substrate 202, a photo-sensing element 212, an isolation region 208, a transfer transistor 210 and a capacitor structure 230. The photo-sensing element 212 includes an N-type conducting region that is formed in the silicon substrate 202. The conducting region forms a P-N junction with the P-type material of the silicon substrate 202 to collect photoelectric charges. Therefore, the photo-sensing element 212 is capable of converting a light beam impinging thereon into photoelectric charges. The transfer transistor 210 includes a gate oxide 205, a gate electrode 207 and a spacer 211. The transfer transistor 210 is coupled to a sensing node 203. The sensing node 203 is implanted with $N^+$ dopants for transferring the photoelectric charges to the sensing node 203 in response to a transfer control signal. Although the other devices, e.g., a reset transistor or an amplification transistor, are not shown for the sake of the simplicity, the sensing node can be connected to the other devices.

The capacitor structure 230 includes an insulating film 231, a bottom electrode 233, a spacer 232, a capacitor dielectric 234 and a top electrode 235. In the preferred embodiment, the insulating film 231 is made of a material, e.g., SiOx or the like, used for the gate oxide 205. The bottom electrode 233 is also made of a material, e.g., doped polysilicon or the like, used for the gate electrode 207. It is possible that the gate oxide 205 and the insulating film 231 can be made of a high K dielectric material such as $Ta_2O_5$.

In FIGS. 4A to 4E, there are Illustrated manufacturing steps involved in manufacturing the image sensor 200 in accordance with a first preferred embodiment of the present invention.

Figure 4A:
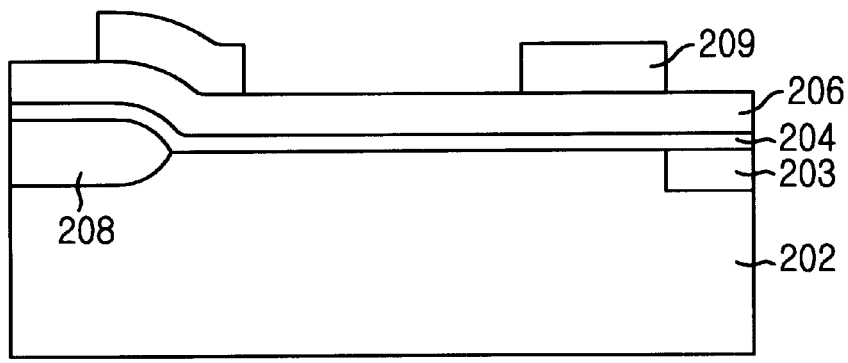
FIGS. 4A to 4E are schematic cross-sectional views illustrating a method for the manufacture of a CMOS image sensor shown in FIG. 3.

The process for manufacturing the image sensor 200 begins with the preparation of a silicon substrate 202 provided with an isolation region 208 and a sensing node 203 formed therein. Thereafter, a first dielectric layer 204, e.g., made of $SiO_2$, is formed on the silicon substrate 202 by using a method such as a chemical vapor deposition (CVD). A first conductive layer 206, e.g., made of doped polysilicon, formed on top of the first dielectric layer 204 by using a method such as CVD. In order to define a conducting region, a transfer transistor and a capacitor structure, a first photoresist layer is formed on top of the first conductive layer 206 and patterned into a predetermined configuration, thereby obtaining a patterned photoresist layer 209, as shown in FIG. 4A. It is preferable that the silicon substrate 202 is prepared with forming a P-type epitaxial layer on a P-type substrate, wherein an impurity concentration of the P-type epitaxial layer is lower than that of the P-type substrate.

Figure 4B:
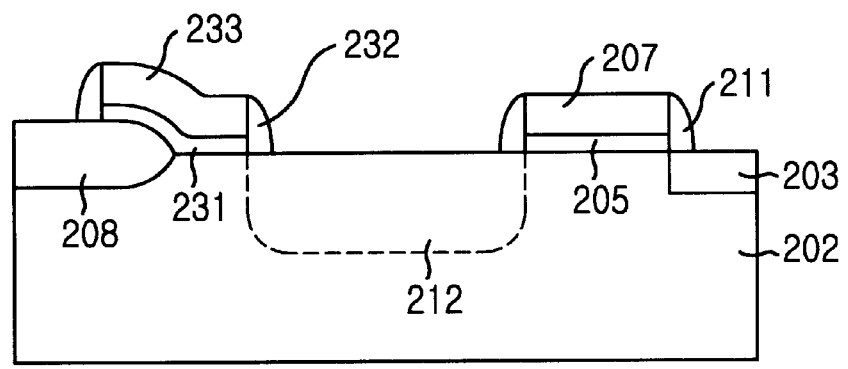

In an ensuing step, portions of the first conductive layer 206 and the first dielectric layer 204, which are not covered with the patterned photoresist layer 209, are removed by using an etching process, thereby obtaining an insulating film 231, a bottom electrode 233, a gate dielectric 205 and a gate electrode 207, as shown in FIG. 4B. Optionally, a spacer 211 can be formed on sides of the gate dielectric 205 and the gate electrode 207. A spacer 232 also can be formed on sides of the insulating film 231 and the bottom electrode 233. Thereafter, first $N^+$ dopants are implanted into a sending node 203 and second $N^+$ dopants are implanted into the conducting region 212, wherein the impurity of the second $N^+$ dopants is deeper than that of the first $N^+$ dopants.

Figure 4C:
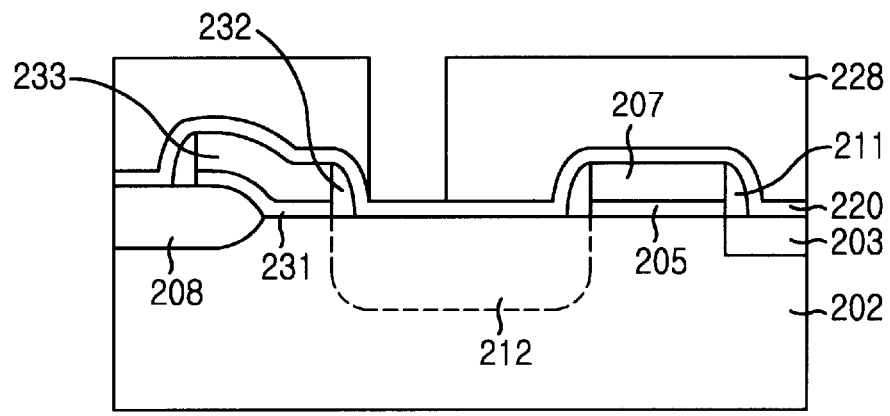

In a next step, a second dielectric layer 220 is formed on top of the bottom electrode 233 and the gate electrode 207. A second photoresist layer is formed on top of the second dielectric layer 220 by using a method such as a spin coating and patterned into a preset configuration 228 to define a contact hole, as shown in FIG. 4C. Thereafter, the second dielectric layer 220 is etched by using a chemical, thereby exposing a portion of the conducting region 212.

Figure 4D:
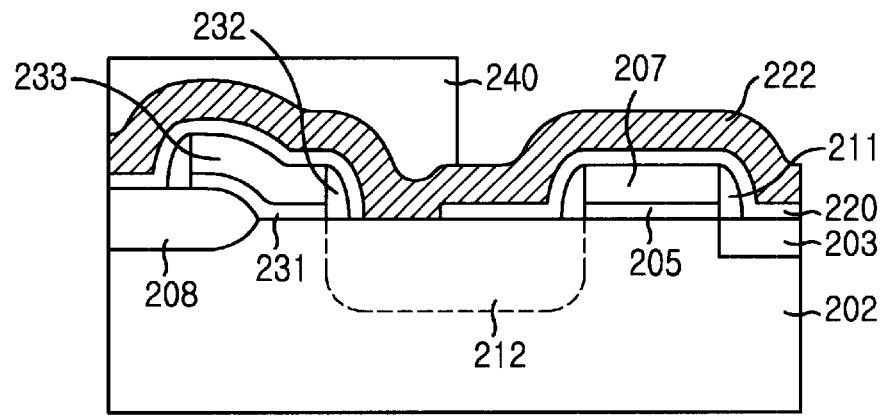

In a following step, a second conductive layer 222, e.g., made of doped polysilicon, is formed in the contact hole and formed on top of the second dielectric layer 220. And then, a third photoresist layer is formed on top of the second conductive layer 222 and patterned into a certain configuration 240 to define a capacitor structure, as shown in FIG. 4D.

Figure 4E:
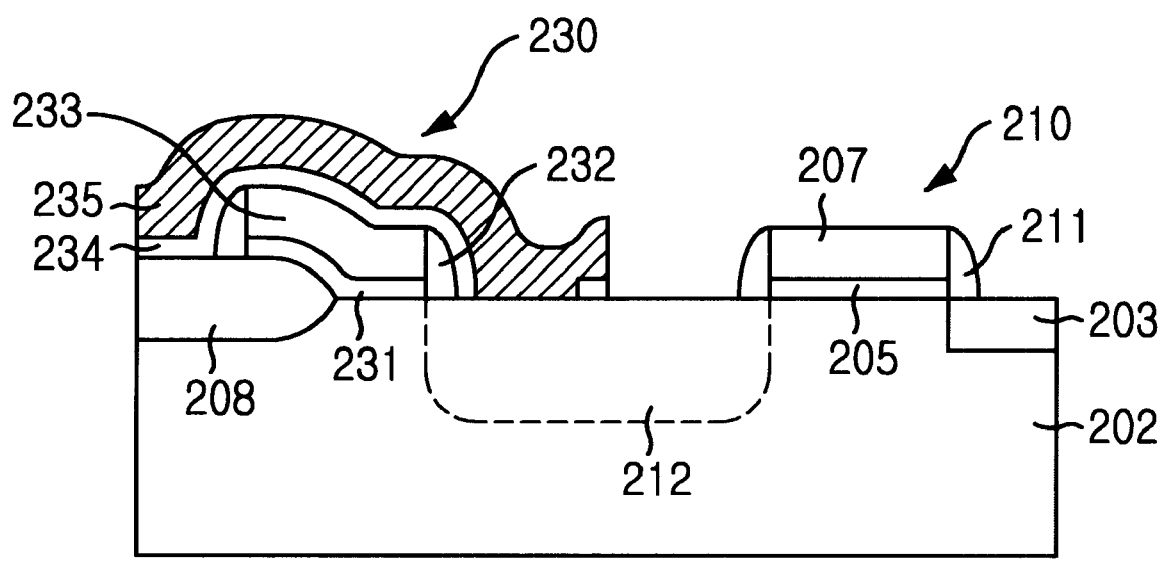

Thereafter, portions of the second conductive layer 222 and the second dielectric layer 220 are removed by using a method such as a chemical etching, thereby obtaining the capacitor structure 230, as shown in FIG. 4E.

In comparison with the prior art, the present invention can reduce the steps of the manufacturing the image sensor 2000. This is achieved by forming elements, e.g., the insulating film 231, of the capacitor structure 230 and elements, e.g., the gate dielectric 205, of the transfer transistor 210 in the same process.

Figure 5:
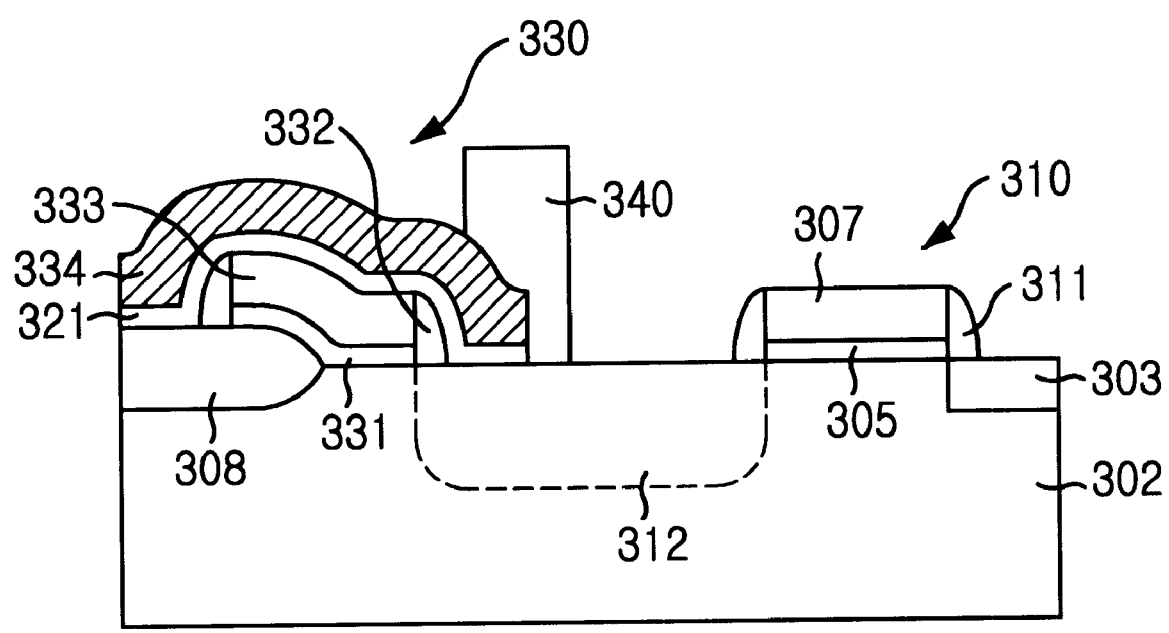
FIG. 5 is a cross-sectional view setting forth a CMOS imager sensor in accordance with a second preferred embodiment of the present invention.

Alternatively, in FIG. 5, there is provided a cross sectional view of an image sensor 300 in accordance with a second preferred embodiment of the present invention. The image sensor 300 comprises a silicon substrate 302, a photo-sensing element 312, an isolation region 308, a transfer transistor 310 and a capacitor structure 330.

The inventive image sensor 300 is similar to the image sensor 200 shown in FIG. 3 except that the top electrode 334 does not directly contact to the photo-sensing element 312. In the second preferred embodiment, the top electrode 334 can be electrically connected to the photo-sensing element 312 through a conducting member 340.

In FIGS. 6A to 6E, there are illustrated manufacturing steps involved in manufacturing the image sensor 300 in accordance with the second preferred embodiment of the present invention.

Figure 6A:
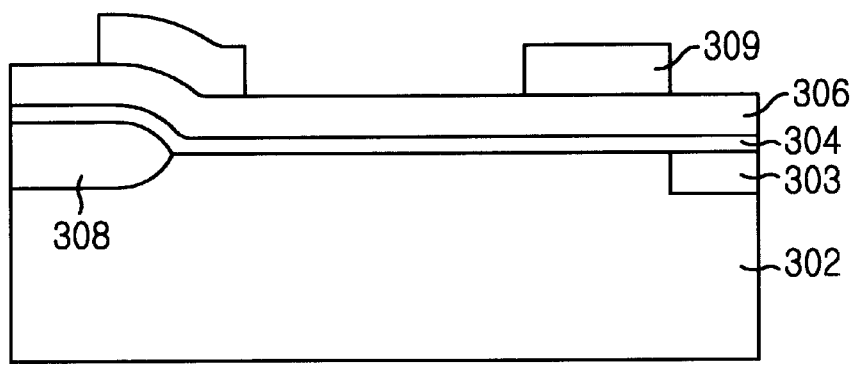
FIGS. 6A to 6E show schematic cross-sectional views depicting a method for the manufacture of a CMOS image sensor in accordance with a second preferred embodiment of the present invention.

The process for manufacturing the image sensor 300 begins with the preparation of a silicon substrate 302 provided with an isolation region 308 and a sensing node 303 formed therein. Thereafter, a first dielectric layer 304, e.g., made of $SiO_2$, is formed on the silicon substrate 302 by using a method such as a chemical vapor deposition (CVD). A first conductive layer 306, e.g., made of doped polysilicon, formed on top of the first dielectric layer 304 by using a method such as CVD. In order to define a conducting region, a transfer transistor and a capacitor structure, a first photoresist layer is formed on top of the first conductive layer 306 and patterned into a predetermined configuration, thereby obtaining a patterned photoresist layer 309, as shown in FIG. 6A. It is preferable that the silicon substrate 302 is prepared with forming a P-type epitaxial layer on a P-type substrate, wherein an impurity concentration of the P-type epitaxial layer is lower than that of the P-type substrate.

Figure 6B:
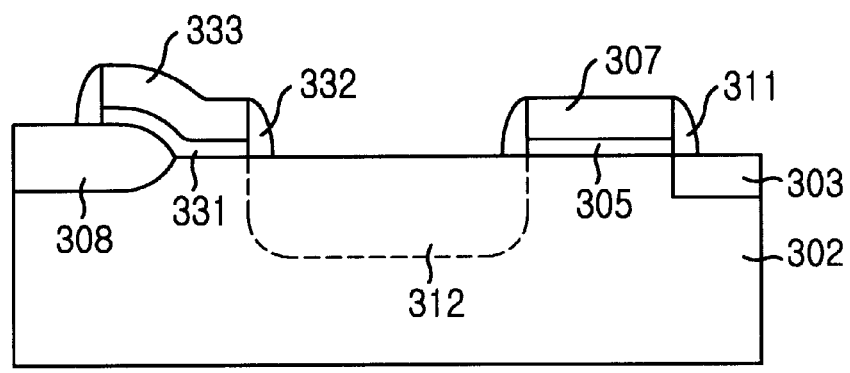

In an ensuing step, portions of the first conductive layer 306 and the first dielectric layer 304, which are not covered with the patterned photoresist layer 309, are removed by using an etching process, thereby obtaining an insulating film 331, a bottom electrode 333, a gate dielectric 305 and a gate electrode 307, as shown in FIG. 6B. Optionally, a spacer 311 can be formed on sides of the gate dielectric 305 and the gate electrode 307. A spacer 332 also can be formed on sides of the insulating film 331 and the bottom electrode 333. Thereafter, first $N^+$ dopants are implanted into a sending node 303 and second $N^+$ dopants are implanted into the conducting region 312, wherein the impurity of the second $N^+$ dopants is deeper than that of the first $N^+$ dopants.

Figure 6C:
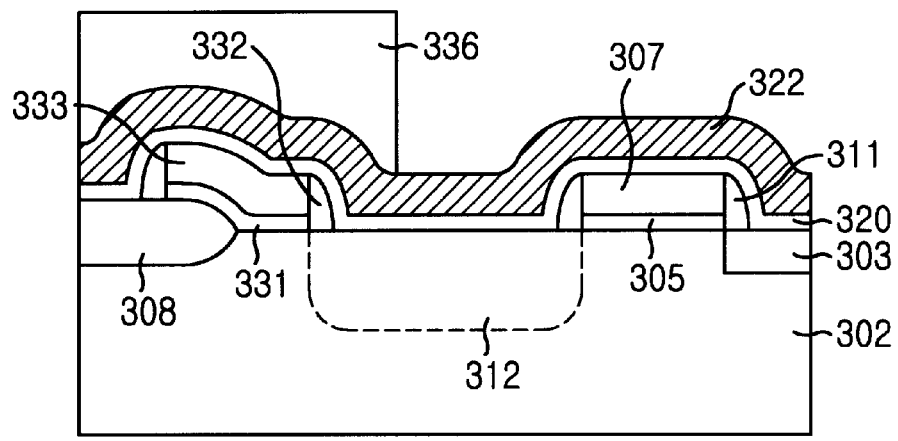

In a next step, a second dielectric layer 320 is formed on top of the bottom electrode 333 and the gate electrode 307. A second conductive layer 322, e.g., made of doped polysilicon, is formed on the second dielectric layer 320, successively. And then, a second photoresist layer is formed on top of the second conductive layer 322 and patterned into a certain configuration 336 to define a capacitor structure, as shown in FIG. 6C.

Figure 6D:
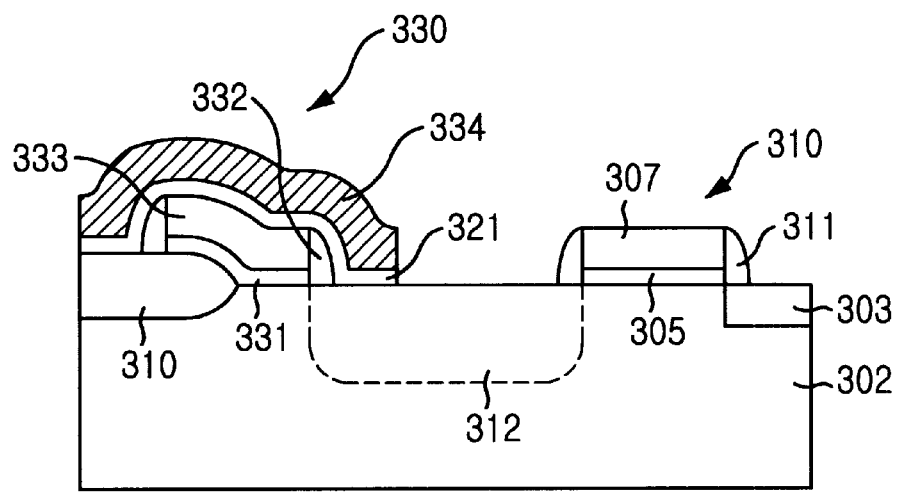
Figure 6E:
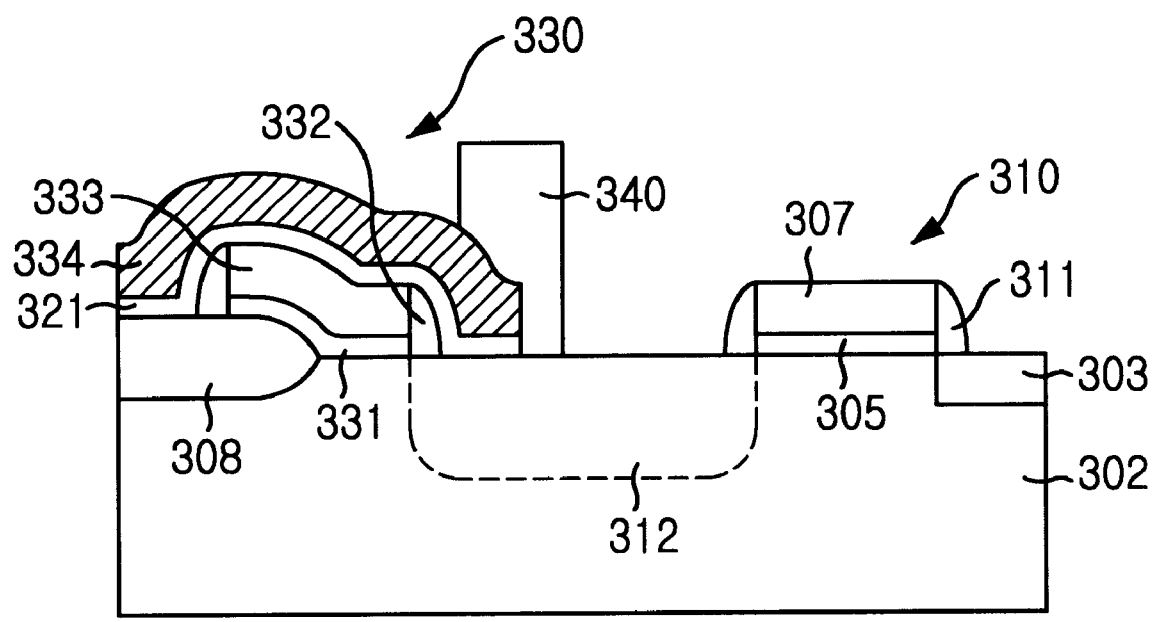

Thereafter, portions of the second conductive layer 322 and the second dielectric layer 320, which are not covered with the certain configuration 336 of the second photoresist layer, are removed by using a method such as a chemical etching, thereby obtaining the capacitor structure 330, as shown in FIG. 6D.

Finally, a conductive member 340 is formed on top of the photo-sensing element 312 with extending over the top electrode 334 of the capacitor structure 330 in such a way that the photo-sensing element 312 is electrically connected to the top electrode 334.

While the present invention has been described with respect to the particular embodiments, it will be apparent to those skilled in the art that various changes and modifications may be made without departing from the scope of the invention as defined in the following claims.

What is claimed is:

1. An image sensor formed on a semiconductor substrate and provided with a plurality of unit pixels, each unit pixel comprising:
    a photoelectric element for sensing a light beam incident thereto and generating photoelectric charges;
    a transistor including a gate dielectric formed adjacent to the photoelectric element and a gate electrode formed on top of the gate dielectric; and
    a capacitor structure including:
        (a) an insulating film formed on surface of the semiconductor substrate adjacent to the photoelectric element;
        (b) a bottom electrode formed on top of the insulating film;
        (c) a capacitor dielectric layer formed on top of the bottom electrode; and
        (d) a top electrode formed on top of the capacitor dielectric layer and making contact to the photoelectric element.

2. The image sensor of claim 1, wherein the capacitor structure stores excessive charges which are generated when the photoelectric element is fully accumulated with the photoelectric charges.

3. The image sensor of claim 1, wherein the transistor is capable of transferring the photoelectric charges to a sensing node.

4. The image sensor of claim 1, wherein the insulating film and the gate dielectric are formed of the same material.

5. The image sensor of claim 4, wherein the bottom electrode and the gate electrode are formed of the same material.

6. The image sensor of claim 1, wherein the gate dielectric is made of silicon oxide (SiOx).

7. The image sensor of claim 1, wherein the gate dielectric is made of a high K dielectric material such as tantalum oxide ($Ta_2O_5$.

8. The image sensor of claim 1 wherein the top electrode of the capacitor structure directly contacts the photoelectric element.

9. The image sensor of claim 1 wherein the top electrode of the capacitor contacts the photoelectric element via another electrically conductive material.

10. The image sensor of claim 9 further comprising a conducting member electrically coupling the top electrode to the photoelectric element.

11. The image sensor of claim 1 wherein the capacitor structure further comprises spacers disposed on either sides of the bottom electrode.

12. The image sensor of claim 1 wherein the capacitor dielectric layer directly contacts the photoelectric element.

* * * * *